(12) United States Patent
Kim et al.

(10) Patent No.: US 7,155,359 B1
(45) Date of Patent: Dec. 26, 2006

(54) DETERMINATION OF DEVICE FAILURE CHARACTERISTIC

(75) Inventors: Hyeon-Seag Kim, San Jose, CA (US); Amit Marathe, Sunnyvale, CA (US); Kurt Taylor, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 184 days.

(21) Appl. No.: 10/884,208

(22) Filed: Jul. 2, 2004

(51) Int. Cl.
*G06F 15/00* (2006.01)

(52) U.S. Cl. ...................................... 702/117; 702/108

(58) Field of Classification Search ................ 702/117, 702/108; 324/769
See application file for complete search history.

(56) References Cited

U.S. PATENT DOCUMENTS 6,414,508 B1 * 7/2002 London ....................... 324/765
6,858,448 B1 * 2/2005 Okada .......................... 438/14
2002/0030191 A1 * 3/2002 Das et al. ..................... 257/77

OTHER PUBLICATIONS

Lin, W; Pey, K; Dong, Z; Chooi, S; Ang, C; Zheng, J;"The Statistical Distribution of Perculation Current for Soft Breakdown in Ultrathin Gate Oxide"; IEEE Electron Device Letters; vol. 24, Issue 5, May 2003; pp. 336-338.*

* cited by examiner

*Primary Examiner*—John Barlow
*Assistant Examiner*—Douglas N Washburn
(74) *Attorney, Agent, or Firm*—Monica H. Choi

(57) ABSTRACT

For determining a failure characteristic of a semiconductor device, a leakage current characteristic is measured for the semiconductor device to determine a plurality of stress bias zones. A respective set of parameters that define a respective failure characteristic of the semiconductor device is determined for each of the stress bias zones such that the failure characteristic is accurately determined for a wide range of operating voltages.

13 Claims, 6 Drawing Sheets

| Stress Bias Voltage | 10V | 11V | 12V | 13V | 14V |
|---|---|---|---|---|---|
| Weilbull Slope ($E_a$) | 1.35 | 1.23 | 4.07 | 4.62 | 5.51 |
| Scaling Factor (Beta) | 0.74 | 0.81 | 0.25 | 0.22 | 0.18 |

| Stress Method | Fowler-Nordheim | Hot Carrier Injection |
|---|---|---|
| Smaller Device Area | Longer Life-time | Shorter Life-time |
| Higher Temperature | Shorter Life-time | Longer Life-time |

US 7,155,359 B1

DETERMINATION OF DEVICE FAILURE CHARACTERISTIC

TECHNICAL FIELD

The present invention relates generally to integrated circuit fabrication, and more particularly, to accurately determining the failure characteristic of a semiconductor device such as a MOSFET (metal oxide semiconductor field effect transistor).

BACKGROUND OF THE INVENTION

The failure characteristic of a semiconductor device is an important specification for customers of the semiconductor device. The failure characteristic typically includes an expected life-time of the semiconductor device. For determining such a failure characteristic, the semiconductor device is stressed with application of stress bias voltages.

FIG. 1 shows a MOSFET (metal oxide semiconductor field effect transistor) 100 as the semiconductor device that is a common component of integrated circuits. The MOSFET 100 includes a drain 102, a source 104, a gate dielectric 106, and a gate structure 108 formed within an active device area 110 of the semiconductor substrate 112. The active device area 110 is surrounded by STI (shallow trench isolation) structures 114.

One prior art method of determining the failure characteristic of the MOSFET 100 is termed the HCI (hot carrier injection) stress method. For the HCI stress method, a drain to source voltage $V_{DS}$ 116 is applied across the drain 102 and the source 104 of the MOSFET 100. In addition, a gate to source voltage $V_{GS}$ 118 is applied across the gate structure 108 and the source 104 of the MOSFET 100.

FIG. 2 shows a plot 120 of drain current IDS versus the drain to source voltage $V_{DS}$ for the MOSFET 100. At a snap back voltage $V_{DS\_sb}$ 122, the drain current begins to ramp up more sharply as the MOSFET 100 is no longer in saturation. The drain to source voltage $V_{DS}$ for the HCI stress method is typically required to be less than the snap back voltage $V_{DS\_sb}$ 122.

FIG. 3 shows a plot 124 of the substrate current $I_{sub}$ (i.e., the current flowing through the substrate 112 in FIG. 1) versus the gate to source voltage $V_{GS}$ for the MOSFET 100. The substrate current $I_{sub}$ peaks at a peak gate voltage $V_{Gpeak}$ 126. For maximizing voltage stress on the MOSFET 100 in the HCI stress method, the gate to source voltage $V_{GS}$ is set at the peak gate voltage $V_{Gpeak}$. Typically, $V_{Gpeak} \approx \frac{1}{2} V_{DS\_sb}$.

In the HCI stress method, the MOSFET 100 is stressed with the drain to source voltage $V_{DS}$ 116 being set to be less than the snap back voltage $V_{DS\_sb}$ 122 and with the gate to source voltage $V_{GS}$ 118 being set at the peak gate voltage $V_{Gpeak}$ 126. After such voltage stress for various time periods, device characteristics of the MOSFET 100 are measured for determining the failure characteristic of the MOSFET 100.

In some applications, the MOSFET 100 may need to operate at relatively high voltages such as 9–12 Volts and at relatively high temperatures such as 150° Celsius or above for example. For such operating conditions, the HCI stress method cannot be used when the snap back voltage $V_{DS\_sb}$ 122 for the typical MOSFET is about 7–8 Volts.

The TDDB (time dependent dielectric breakdown) method is another prior art technique for determining the failure characteristic of the semiconductor device such as the MOSFET 100. However, the TDDB method uses capacitor structures for characterizing the quality of the gate dielectric of a MOSFET and is limited in qualifying other characteristics of the MOSFET.

Thus, an accurate failure characterization process is desired for a wide range of device operating conditions including higher operating voltages such as 9–12 Volts and higher temperatures such as 150° Celsius or above, for example.

SUMMARY OF THE INVENTION

Accordingly, in a general aspect of the present invention, parameters defining the failure characteristic of a semiconductor device such as a MOSFET (metal oxide semiconductor field effect transistor) are determined for a plurality of stress bias zones.

In one embodiment of the present invention, for determining a failure characteristic of a semiconductor device, a leakage current characteristic is measured for the semiconductor device to determine a plurality of stress bias zones. In addition, a respective set of parameters that define a respective failure characteristic of the semiconductor device is determined for each of the stress bias zones.

According to another embodiment of the present invention, the semiconductor device is stressed with a respective stress bias voltage within each stress bias zone for determining the respective failure characteristic. In that case, a change to a device characteristic of the semiconductor device is measured after stressing the semiconductor device for determining the respective failure characteristic.

In one example embodiment of the present invention, the semiconductor device is a MOSFET (metal oxide semiconductor field effect transistor). In such an embodiment, the leakage current characteristic is a graph of gate leakage current versus gate stress bias voltage. Additionally for such an embodiment, a respective stress bias voltage is applied to the gate of the MOSFET for FN (Fowler-Nordheim) tunneling for each stress bias zone. In that case, a change to a saturated drain current of the MOSFET is measured after the step of stressing the MOSFET for determining the respective failure characteristic.

For such a MOSFET, the respective failure characteristic is a respective Weibull distribution of device life-time versus failure rate that is expresses as follows:

$$\Sigma = A^* \exp[-B(T_{0x} E_{0x}/X_{eff})]^* \exp(E_a/kT)^* (A_{TC}/A_{prod})^{1/\beta*}(1-1n(1-F))^{1/\beta}$$

$\tau$ is the device life-time; F is the failure rate; $A_{TC}$ is a test chip area; $A_{prod}$ is a product area; k is Boltzmann's constant; T is temperature; $T_{0x}$ is a thickness of the gate dielectric; $E_{0x}$ is an electric field across the gate dielectric; and $X_{eff}$ is a thinning factor for the gate dielectric. A, B, $E_a$, and $\beta$ are the respective set of parameters to be determined for each of the stress bias zones.

In another embodiment of the present invention, a respective plot of failure rate (F) versus stress time period is generated for determining the respective $E_a$ and $\beta$ for each of the stress bias zones. The semiconductor device is defined to fail when a ratio of the change in saturated drain current to the initial saturated drain current ($\Delta I_D/I_{initial}$) reaches 10%. In addition, a respective plot of measured device life-time versus stress bias voltage is generated for determining respective A and B for each of the stress bias zones. Furthermore, a median break-down voltage and a median gate dielectric thickness are determined for determining the thinning factor ($X_{eff}$) for the gate dielectric.

With such a Weibull distribution, the expected device life-time ($\tau$) is determined to be higher than as determined using the conventional HCI (hot carrier injection) stress method when the MOSFET has a smaller area. In addition, the expected device life-time ($\tau$) is determined to be shorter than as determined using the conventional HCI (hot carrier injection) stress method for higher temperature.

In this manner, parameters defining a respective failure characteristic of the MOSFET are determined for a plurality of stress bias zones. Thus, the failure characteristic of the MOSFET is accurately determined for a wide range of operating voltages such as the relatively high voltage range of 9–12 Volts. In addition, by stressing the MOSFET with Fowler-Nordheim tunneling, the failure characteristic of the MOSFET is accurately determined for higher temperatures such as 150° Celsius or above.

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference number in FIGS. 1, 2, 3, 4, 5, 6, 7, 8, 9, 10, 11, 12, 13, and 14 refer to elements having similar structure and function.

DETAILED DESCRIPTION

Figure 1:
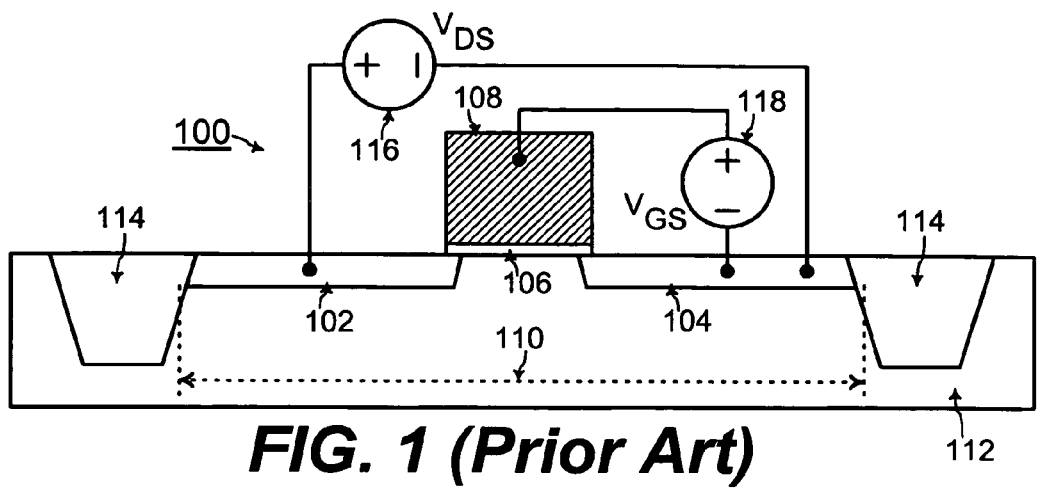
FIG. 1 shows a MOSFET (metal oxide semiconductor field effect transistor) having stress bias voltages applied thereon, according to a HCI (hot carrier injection) stress method of the prior art.
Figure 2:
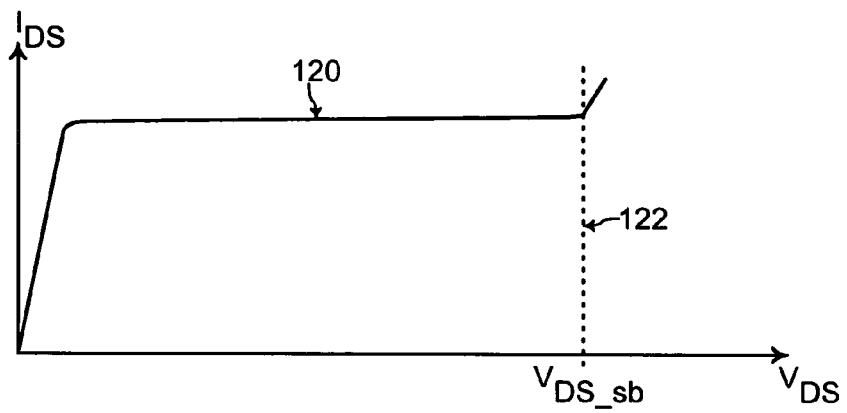
FIG. 2 shows a plot of drain current $I_{DS}$ versus drain to source voltage $V_{DS}$ for the MOSFET of FIG. 1, according to the prior art.
Figure 3:
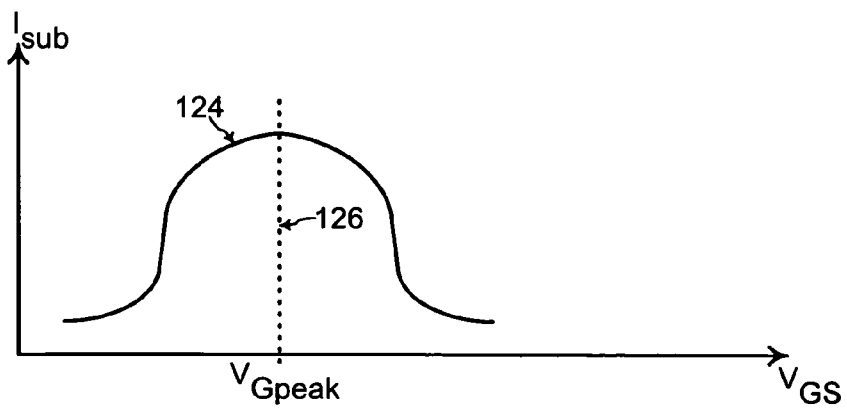
FIG. 3 shows a plot of substrate current $I_{sub}$ versus gate to source voltage $V_{GS}$ for the MOSFET of FIG. 1, according to the prior art.
Figure 4:
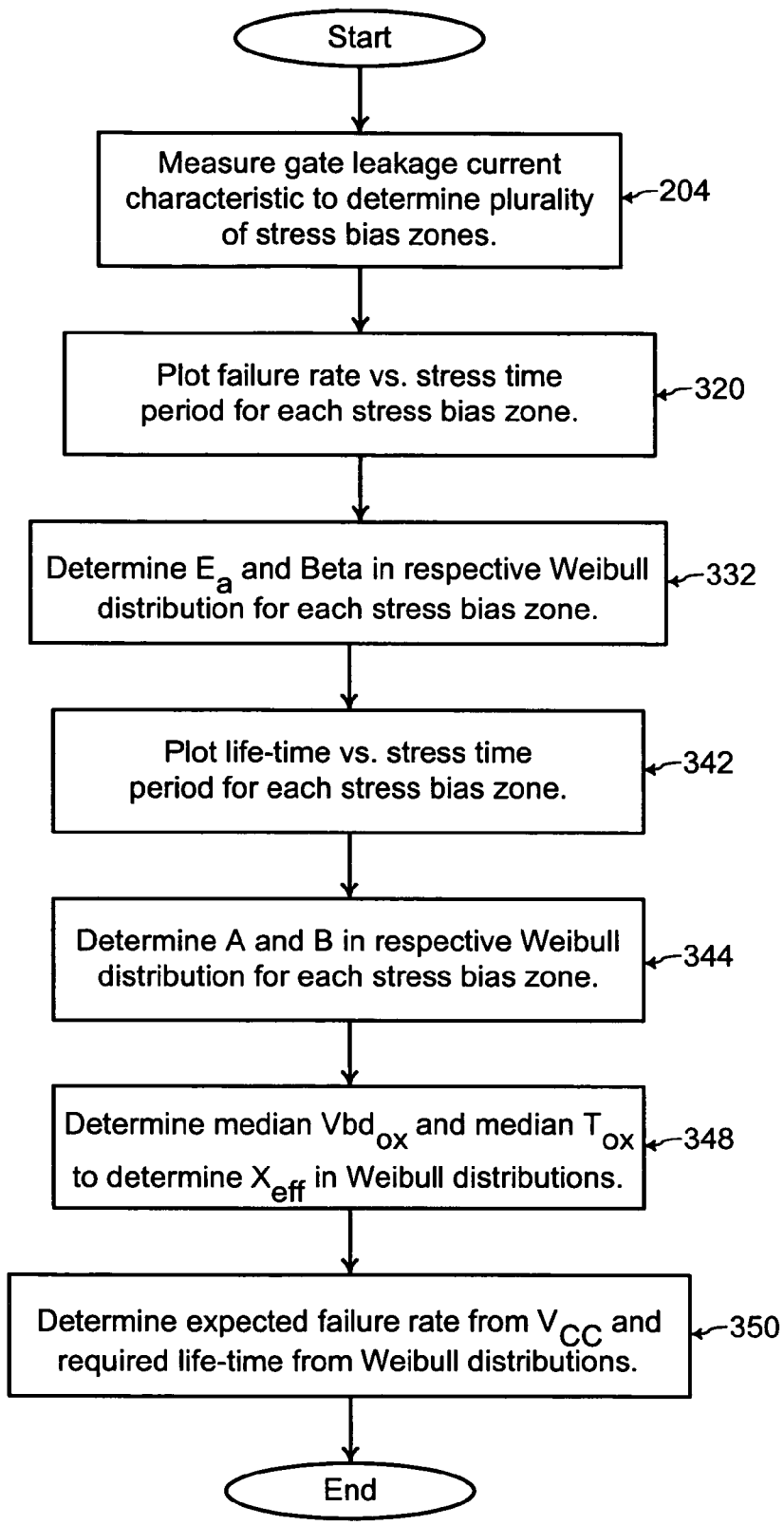
FIG. 4 shows a flowchart with steps for determining a respective failure characteristic of test MOSFETs (metal oxide semiconductor field effect transistors) for a plurality of stress bias zones, according to an embodiment of the present invention.
Figure 5:
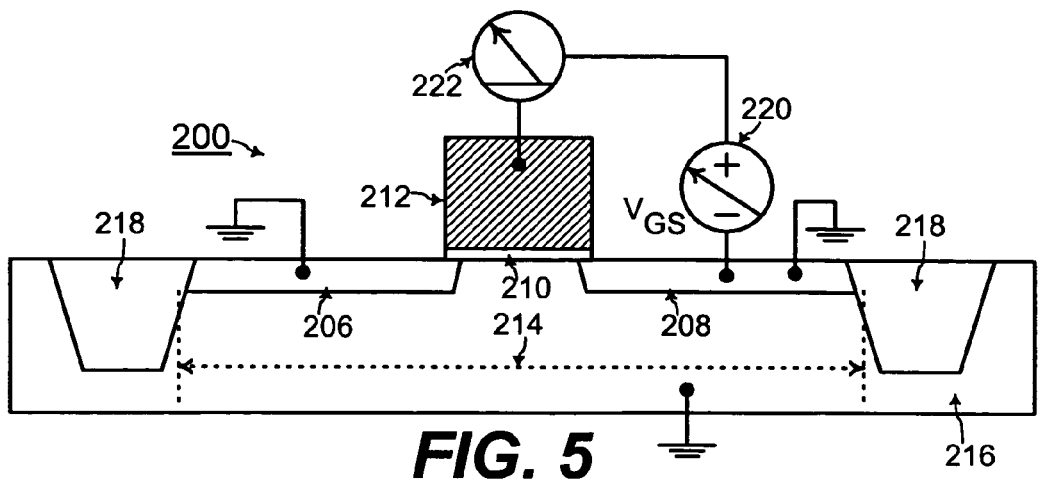
FIG. 5 illustrates measurement of a gate leakage current characteristic for determining a plurality of stress bias zones, according to an embodiment of the present invention.

FIG. 4 shows a flowchart with steps for determining a respective failure characteristic of test MOSFETs (metal oxide semiconductor field effect transistors) such as a test MOSFET 200 of FIG. 5 for a plurality of stress bias zones, according to an embodiment of the present invention. First, a gate leakage current characteristic 202 as illustrated in FIG. 6 is measured (step 204 of FIG. 4).

Referring to FIG. 5, the MOSFET 200 includes a drain 206, a source 208, a gate dielectric 210, and a gate structure 212 formed within an active device area 214 of the semiconductor substrate 216. The active device area 214 is surrounded by STI (shallow trench isolation) structures 218. For measuring the gate leakage current characteristic 202, a variable gate bias voltage source 220 and a current meter 222 are coupled in series between the gate structure 212 and the source 208 of the MOSFET 200. In addition, the drain 206, the source 208, and the substrate 216 are coupled to ground.

Figure 6:
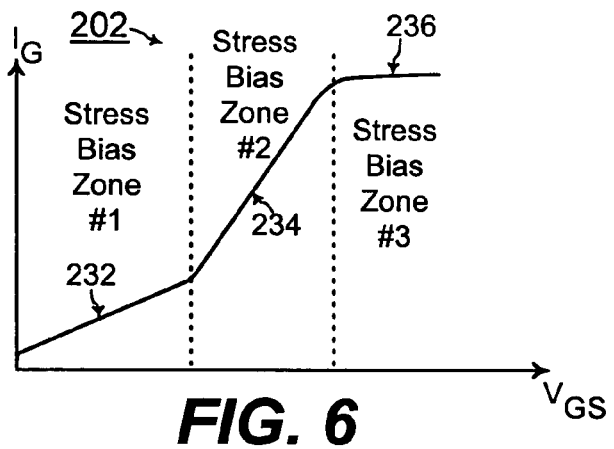
FIG. 6 shows an exampled gate leakage current characteristic as measured in FIG. 5, according to an embodiment of the present invention.

Referring to FIGS. 5 and 6, the magnitude of a gate to source voltage, $V_{GS}$, from the voltage source 220 is increased and the resulting gate leakage current, $I_G$, is measured with the current source 222. FIG. 6 shows such a measured gate leakage current characteristic 202 for a typical MOSFET 200. The gate leakage current characteristic 202 includes a first stress bias zone 232, a second stress bias zone 234, and a third stress bias zone 236. The gate leakage current characteristic 202 has a different slope in each of the stress bias zones 232, 234, and 236.

Figure 7:
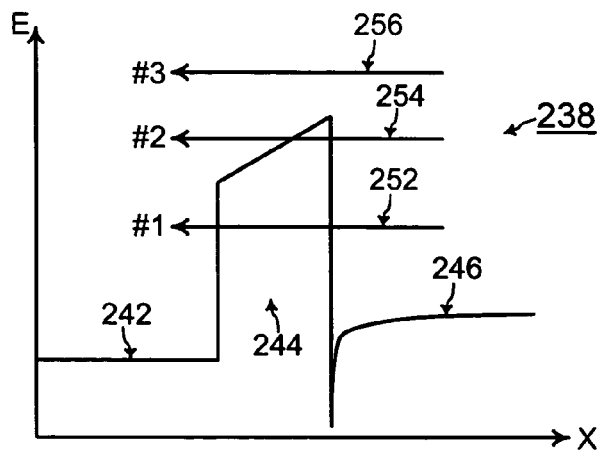
FIG. 7 shows an example band-gap energy diagram for a typical MOSFET with electric fields for the plurality of stress bias zones, according to an embodiment of the present invention.

Such different slopes of the stress bias zones 232, 234, and 236 are explained by a band-gap diagram 238 of the MOSFET 200, as illustrated in FIG. 7. The band-gap diagram 238 is a plot of the band-gap energy (E) versus the position (X) of structures of the MOSFET 200. A first portion 242 of the band-gap diagram 238 is for the gate structure 212 of the MOSFET 200. In addition, a second portion 244 of the band-gap diagram 238 is for the gate dielectric 210 of the MOSFET 200. Moreover, a third portion 246 of the band-gap diagram 238 is for the substrate 216 of the MOSFET 200.

The higher second portion 244 of the band-gap diagram 238 illustrates the potential barrier a charge carrier needs to overcome in order to contribute to the gate leakage current. Referring to FIGS. 6 and 7, a first electric field level 252 is illustrated for the first stress bias zone 232, a second electric field level 254 is illustrated for the second stress bias zone 234, and a third electric field level 256 is illustrated for the third stress bias zone 236. Each of the stress bias zones 232, 234, and 236 has a different slope in FIG. 6 because of different leakage current mechanisms through the gate dielectric 210 of the MOSFET 200 as illustrated by the different electric field levels 252, 254, and 256 for each of the stress bias zones 232, 234, and 236 in FIG. 7.

Figure 8:
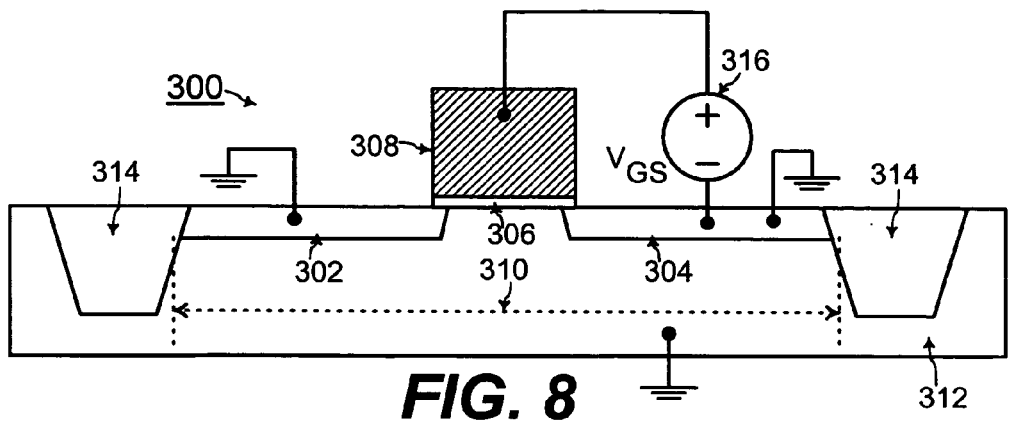
FIG. 8 illustrates a gate stress bias voltage being applied on a MOSFET for Fowler-Nordheim tunneling, according to an embodiment of the present invention.

Referring to FIG. 8, after determining the plurality of the stress bias zones 232, 234, and 236, another test MOSFET 300 is stressed with a respective stress bias voltage applied on the gate structure of the MOSFET 300. The MOSFET 300 includes a drain 302, a source 304, a gate dielectric 306, and a gate structure 308 formed within an active device area 310 of the semiconductor substrate 312. The active device area 310 is surrounded by STI (shallow trench isolation) structures 314. The test MOSFET 300 of FIG. 8 is fabricated to be substantially similar to the test MOSFET 200 of FIG. 5.

A stress bias voltage, $V_{GS}$, is applied across the gate structure 308 and the source of the MOSFET 300 from a voltage source 316 while the drain 302, the source 304, and the substrate 312 are coupled to ground. Such a stress bias voltage, $V_{GS}$, causes Fowler-Nordheim charge carrier tunneling through the gate dielectric 306 which degrades the MOSFET 300 for determining failure characteristics of the MOSFET 300.

Figure 9:
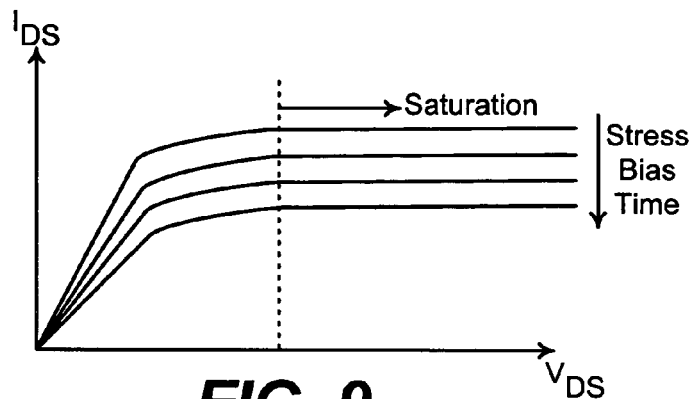
FIG. 9 shows a plurality of drain current characteristics measured after various time periods of applying the gate stress bias voltage, according to an embodiment of the present invention.

A device characteristic of the MOSFET 300 is measured after a time period of applying the stress bias voltage, $V_{GS}$. FIG. 9 illustrates a drain current characteristic of the MOSFET 300 as an example of such a measured device characteristic. The drain current characteristic is a plot of the drain current IDS versus the drain to source voltage $V_{DS}$ for the MOSFET 300. Such a characteristic is measured after the stress bias voltage, $V_{GS}$, is applied for each of a plurality of time periods.

Further referring to FIG. 9, a longer time period of applying the stress bias voltage, $V_{GS}$, in FIG. 8 further degrades the MOSFET 300. Thus, the saturated drain current $I_{DS}$ decreases with longer time period of applying the stress bias voltage, $V_{GS}$, as illustrated in FIG. 9. One way of defining failure of the MOSFET 300 is when the change in saturated drain current $\Delta I_D$ after a time period of applying the stress bias voltage, $V_{GS}$, over the initial $I_{initial}$ saturated drain current measured without any application of a stress bias voltage reaches 10% (i.e., when $\Delta I_D/I_{initial} \geq 10\%$). A stress time period when $\Delta I_D/I_{initial} > 10\%$ is determined for the MOSFET 300 as indicating the device life-time of the MOSFET 300.

Figure 10:
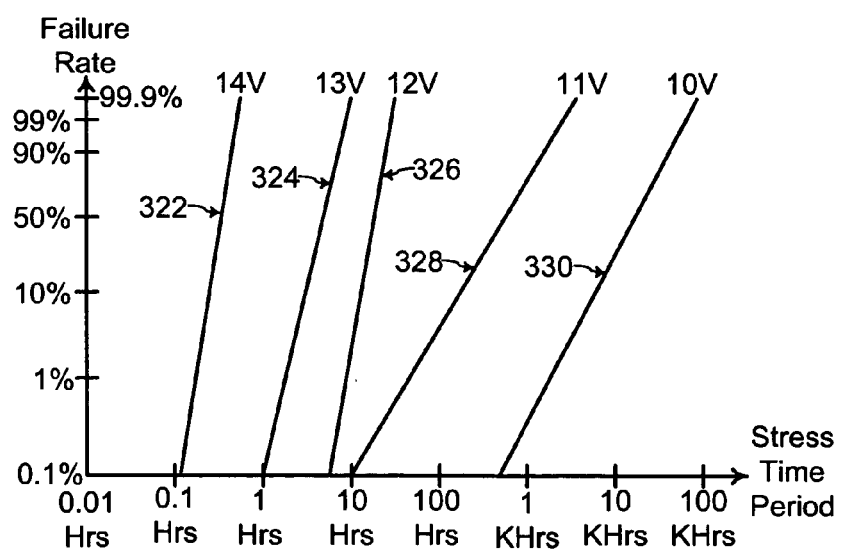
FIG. 10 shows a plot of the log of device failure rate versus the log of stress time period for determining failure characteristic parameters, according to an embodiment of the present invention.

Referring to FIGS. 6, 8, and 9, such a determination is repeated for a respective stress bias voltage, $V_{GS}$, applied on the gate structure of a respective test MOSFET within each of the stress bias zones 232, 234, and 236. Referring to FIG. 10, a respective plot of failure rate versus stress time period is generated for each of a plurality of stress bias voltages, $V_{GS}$ (step 320 of FIG. 4). In FIG. 10, the failure rate and the stress time period are in a logarithmic scale on the Y and X axis. The failure rate indicates a percentage of test MOSFETs that failed after being stressed with the stress bias voltage, $V_{GS}$, being applied across the gate and source of the MOSFET for the stress time period. Any test MOSFETs mentioned herein are fabricated substantially similar to the test MOSFETs 200 and 300 of FIGS. 5 and 8.

Further referring to FIG. 10, a first plot 322 is for the failure rate versus the stress time period when the stress bias voltage, $V_{GS}=14$ Volts. A second plot 324 is for the failure rate versus the stress time period when the stress bias voltage, $V_{GS}=13$ Volts. A third plot 326 is for the failure rate versus the stress time period when the stress bias voltage, $V_{GS}=12$ Volts. A fourth plot 328 is for the failure rate versus the stress time period when the stress bias voltage, $V_{GS}=11$ Volts. A fifth plot 330 is for the failure rate versus the stress time period when the stress bias voltage, $V_{GS}=10$ Volts.

Figures 11, 12, 13:
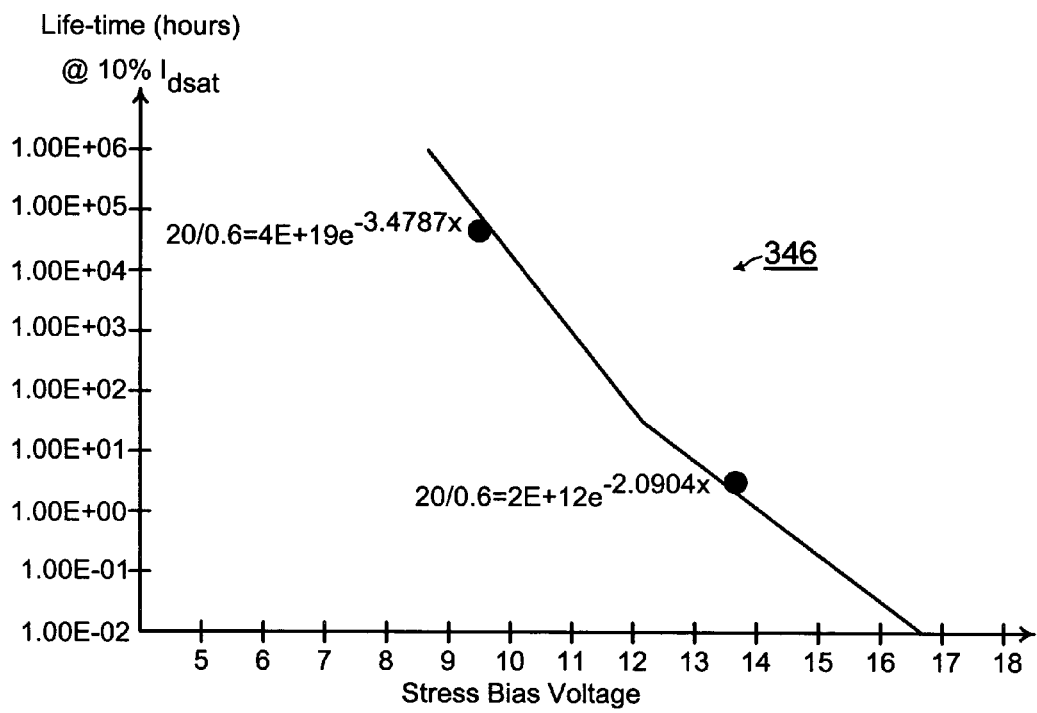
FIG. 11 shows a table of failure characteristic parameters for each of a plurality of stress bias voltages, according to an embodiment of the present invention.
FIG. 12 shows a plot of the log of device life-time versus the stress bias voltage for further determining failure characteristic parameters, according to an embodiment of the present invention.
FIG. 13 shows a table comparing determination of the expected device life-time using the Fowler-Nordheim stress method according to the present invention versus the HCI (hot carrier injection) stress method according to the prior art.

From such plots 322, 324, 326, 328, and 330 of FIG. 10, failure characteristic parameters Ea and β (Beta) are determined for each of the stress bias voltages, as illustrated by the table of FIG. 11. The failure characteristic for the test MOSFETs (such as 200 or 300 of FIGS. 5 and 8 for example) is expressed by the following Weibull distribution in one embodiment of the present invention:

$$\Sigma = A^* \exp[-B(T_{Ox}E_{Ox}/X_{eff})]^* \exp(E_a/kT)^* (A_{TC}/A_{prod})^{1/\beta *}(1-1n(1-F))^{1/\beta}$$

τ is the device life-time; F is the failure rate; $A_{TC}$ is a test chip area; $A_{prod}$ is a product area; k is Boltzmann's constant; T is operating temperature; $T_{Ox}$ is a thickness of a gate dielectric; $E_{Ox}$ is an electric field across the gate dielectric; and $X_{eff}$ is a thinning factor for the gate dielectric. A, B, $E_a$, and β are the respective set of parameters to be determined for each of the stress bias zones. The plots 322, 324, 326, 328, and 330 are used to determine respective $E_a$ and β for each of the stress bias voltage, $V_{GS}$ (step 332 of FIG. 4).

Figure 14:
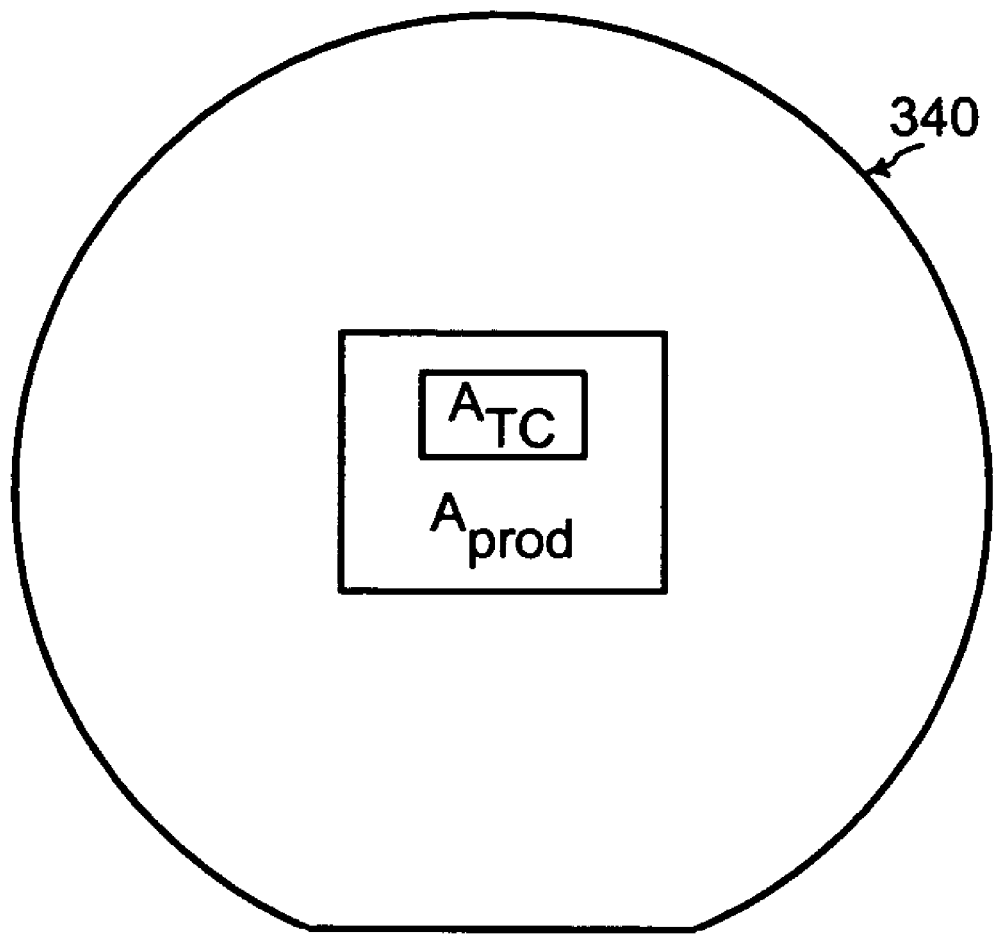
FIG. 14 illustrates a total product area and a test chip area having test MOSFETs fabricated therein.

Referring to FIG. 14, the test MOSFETs used for determining the device failure characteristics is fabricated within the test chip area $A_{TC}$ which is in turn within the total product area $A_{prod}$ fabricated on a semiconductor wafer 340. For example, a flash memory device may be fabricated within the total product area $A_{prod}$.

Referring to FIG. 12, for determining the parameters A and B within the Weibull distribution, a plot 346 is generated for the device life-time versus the stress bias voltage (step 342 of FIG. 4). From such a plot 346, the respective parameters A and B within the respective Weibull distribution are determined for the plurality of stress bias voltages within each of the stress bias zones (step 344 of FIG. 4).

An example in the plot 346 of FIG. 12 is a test MOSFET with width of 20 μm and length of 0.6 μm having parameter A=4E+19 and B=−3.4787 at the stress bias voltage of about 9.2 Volts. A second example is another test MOSFET with width of 20 μm and length of 0.6 μm having parameter A=2E+12 and B=−2.0904 at the stress bias voltage of about 13.5 Volts.

For determining the thinning factor for the gate dielectric, $X_{eff}$, the median gate dielectric break-down voltage, $V_{bdox}$ (50%) and the median gate dielectric thickness $T_{Ox}$(50%) are determined for a plurality of the test MOSFETs fabricated on various lots of semiconductor wafers over an extended period of time. Mechanisms for measuring gate dielectric breakdown and gate dielectric thickness are individually known to one of ordinary skill in the art of integrated circuit fabrication. The thinning factor for the gate dielectric, $X_{eff}$, is then determined according to the following relationship (step 348 of FIG. 4):

$$V_{bdox}(50\%)/T_{Ox}(50\%) = V_{bdox}/X_{eff}$$

$V_{bdox}$ is the gate dielectric break-down voltage of the test MOSFETs fabricated as part of the current lot of semiconductor wafers.

In this manner, a respective set of parameters A, B, $E_a$, and β are determined for a plurality of stress bias voltages within all of the various stress bias zones 232, 234, and 236. Such a respective set of parameters A, B, $E_a$, and β defines a respective Weibull distribution:

$$\Sigma = A^* \exp[-B(T_{Ox}E_{Ox}/X_{eff})]^* \exp(E_a/kT)^* (A_{TC}/A_{prod})^{1/\beta *}(1-1n(1-F))^{1/\beta}$$

for each of the stress bias zones 232, 234, and 236.

Such a Weibull distribution is advantageous for predicting the failure characteristic of a semiconductor device. For example, the expected failure rate, F, is determined given the operating voltage, $V_{CC}$, and the required life-time, τ, as specified by a customer of the semiconductor device (step 350 of FIG. 4). An example is when $V_{CC}=12$ Volts and the required life-time, $\tau=15$ hours, as specified by the customer. In that case, a maximum possible electric field across the gate dielectric, $E_{Ox}$, is determined by $V_{CC}=12$ Volts. In addition, the respective set of parameters A, B, $E_a$, and $\beta$ are determined for the respective Weibull distribution when the stress bias voltage is 12 Volts. From such a Weibull distribution, the failure rate, F, is determined to be about 0.6% for example.

By determining a plurality of different Weibull distributions for different stress bias voltages, the most appropriate Weibull distribution for a particular application of the semiconductor device is selected for accurately predicting the failure rate of the semiconductor device. Different applications of the semiconductor device require the semiconductor device to operate with different $V_{CC}$. Accordingly, the respective Weibull distribution for the stress bias voltage being substantially near $V_{CC}$ is selected for accurately reflecting the failure characteristic of the semiconductor device for that particular application.

Referring to FIG. 8, the MOSFET 300 is stressed predominantly from Fowler-Nordheim tunneling of charge carriers through the gate dielectric 306 of the MOSFET 300. FIG. 13 illustrates different results obtained from such a stress mechanism from the HCI (hot carrier injection) stress method of the prior art. For smaller device area (i.e., for smaller area of the gate dielectric 306), the Fowler-Nordheim stress mechanism of the present invention results in prediction for a longer life-time than the HCI method.

One explanation is that the smaller area of the gate dielectric 306 results in less probability of defect of the gate dielectric 306 for less charge carrier tunneling there-through resulting in less degradation of the MOSFET 300 in the Fowler-Nordheim stress mechanism of the present invention. Such less degradation results in longer expected life-time as predicted from the Fowler-Nordheim stress mechanism of the present invention.

Further referring to FIG. 13, for higher operating temperature, T, (such as T≧150° Celsius for example), the Fowler-Nordheim stress mechanism of the present invention results in prediction for a shorter life-time than the HCI method. One explanation is that with higher lattice vibration of the substrate 312 at higher temperature, the charge carriers are thwarted from being accelerated in the HCI method. Such lower charge carrier acceleration results in less degradation and thus in longer life-time of the MOSFET 300 in the HCI method.

The foregoing is by way of example only and is not intended to be limiting. For example, the present invention is described in reference to determining the failure characteristic of a MOSFET as the typical semiconductor device. However, the present invention may also be applied for other types of semiconductor devices. Furthermore, any dimensions and materials specified herein are by way of example only.

The present invention is limited only as defined in the following claims and equivalents thereof.

We claim:

1. A method for determining a failure characteristic of a field effect transistor, comprising:
    measuring and plotting a leakage current characteristic that is a graph of a gate leakage current versus gate stress bias voltage for the field effect transistor to determine a plurality of stress bias zones, wherein the stress bias zones have different slopes in the graph of the leakage current characteristic; and
    plotting a respective failure characteristic of the field effect transistor for each of the stress bias zones;
    wherein the gate leakage current is measured across a gate and a source of the field effect transistor.

2. The method of claim 1, further comprising:
    stressing the field effect transistor with a respective stress bias voltage within each stress bias zone for determining the respective failure characteristic.

3. The method of claim 2, further comprising:
    measuring a change to a device characteristic of the field effect transistor after the step of stressing the field effect transistor for determining the respective failure characteristic.

4. The method of claim 1, wherein the field effect transistor is a MOSFET (metal oxide semiconductor field effect transistor).

5. The method of claim 4, further comprising:
    stressing the MOSFET with a respective stress bias voltage applied to the gate of the MOSFET for FN (Fowler-Nordheim) tunneling for each stress bias zone.

6. The method of claim 5, further comprising:
    measuring a change to a saturated drain current of the MOSFET after the step of stressing the MOSFET for determining the respective failure characteristic.

7. The method of claim 4, further comprising:
    plotting a respective failure rate (F) versus stress time period for determining respective $E_a$ and $\beta$ in a respective Weibull distribution for each of the stress bias zones, the respective Weibull distribution being expressed as follows:

$$\Sigma = A^* \exp[-B(T_{0x} E_{0x}/X_{e\!f\!f})]^* \exp(E_a/kT)^* (A_{TC}/A_{prod})^{1/\beta} * (1 - 1n(1-F))^{1/\beta}$$

wherein, $\tau$ is the device life-time, F is the failure rate, $A_{TC}$ is a test chip area, $A_{prod}$ is a product area, k is Boltzmann's constant, T is operating temperature, $T_{Ox}$ is a thickness of the gate dielectric, $E_{Ox}$ is an electric field across the gate dielectric, and $X_{e\!f\!f}$ is a thinning factor for the gate dielectric, and wherein A, B, $E_a$, and $\beta$ are a respective set of parameters to be determined for each of the stress bias zones.

8. The method of claim 7, wherein the semiconductor device is defined to fail when a ratio of change in saturated drain current to initial saturated drain current ($\Delta I_D/I_{initial}$) reaches 10%.

9. The method of claim 7, further comprising:
    plotting a respective measured device life-time versus stress bias voltage for determining the respective A and B in the respective Weibull distribution for each of the stress bias zones.

10. The method of claim 9, wherein the measured device life-time of the semiconductor device is defined as when a ratio of change in saturated drain current to initial saturated drain current ($\Delta I_D/I_{initial}$) reaches 10%.

11. The method of claim 7, further comprising:
    determining a median break-down voltage and a median gate dielectric thickness for determining the thinning factor ($X_{e\!f\!f}$) for the gate dielectric.

12. The method of claim 7, wherein the expected device life-time ($\tau$) is determined to be higher than as determined using HCI (hot carrier injection) stress when the MOSFET has a smaller area.

13. The method of claim 7, wherein the expected device life-time ($\tau$) is determined to be shorter than as determined using HCI (hot carrier injection) stress for higher temperature.

* * * * *